(12) United States Patent
Chi et al.

(10) Patent No.: US 9,999,145 B2
(45) Date of Patent: Jun. 12, 2018

(54) POWER MODULE HAVING PACKAGING STRUCTURE

(71) Applicant: DELTA ELECTRONICS, INC., Taoyuan (TW)

(72) Inventors: Wei-Hao Chi, Taoyuan (TW); Hsueh-Kuo Liao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days. days.

(21) Appl. No.: 15/232,169

(22) Filed: Aug. 9, 2016

(65) Prior Publication Data

US 2017/0374755 A1   Dec. 28, 2017

(30) Foreign Application Priority Data

Jun. 23, 2016   (CN) .......................... 2016 1 0463334

(51) Int. Cl.
| | |
|---|---|
| *H05K 5/02* | (2006.01) |
| *H05K 7/14* | (2006.01) |
| *H05K 1/02* | (2006.01) |
| *H01L 25/07* | (2006.01) |
| *H01L 25/11* | (2006.01) |
| *H05K 5/00* | (2006.01) |

(52) U.S. Cl.
CPC ......... *H05K 5/0247* (2013.01); *H01L 25/072* (2013.01); *H01L 25/115* (2013.01); *H05K 1/0268* (2013.01); *H05K 5/0013* (2013.01); *H05K 5/0069* (2013.01); *H05K 7/1401* (2013.01)

(58) Field of Classification Search
CPC .................................................. H05K 5/0247
See application file for complete search history.

(56) References Cited

U.S. PATENT DOCUMENTS

| | | | | |
|---|---|---|---|---|
| 6,441,317 | B1* | 8/2002 | Tanaka ................... | H01L 25/072 |
| | | | | 174/255 |
| 6,629,854 | B2* | 10/2003 | Murakami ............... | H02B 1/20 |
| | | | | 439/212 |
| 6,636,429 | B2* | 10/2003 | Maly ....................... | H01L 23/50 |
| | | | | 257/666 |
| 6,906,404 | B2* | 6/2005 | Maly ....................... | H01L 24/49 |
| | | | | 257/678 |
| 7,542,317 | B2* | 6/2009 | Azuma ................... | H01L 24/40 |
| | | | | 257/177 |

(Continued)

*Primary Examiner* — David M Sinclair
*Assistant Examiner* — Robert Brown
(74) *Attorney, Agent, or Firm* — Hauptman Ham, LLP

(57) ABSTRACT

A power module having a packaging structure includes a substrate having a first conductive area, a second conductive area, a third conductive area, a first fixing area and a second fixing area. The first, the second and the third conductive areas are electrically connected to a first terminal, a second terminal and a third terminal, and the first and the second fixing areas are electrically connected to a first switch set and a second switch set, so that they are in a parallel arrangement. The first terminal is a current input end, the second terminal is an intermediate end, and the third terminal is a current output end. When a current flows from the current input end to the intermediate end, or from the intermediate end to the current output end, the current flows straightly in order to reduce a crossover area and lower the stray inductance.

19 Claims, 9 Drawing Sheets

(56) References Cited

U.S. PATENT DOCUMENTS

| | | | | |
|---|---|---|---|---|
| 8,035,982 B2* | 10/2011 | Kontani | ................ | H01L 23/642 |
| | | | | 361/611 |
| 8,076,696 B2* | 12/2011 | Beaupre | ................ | H01L 24/49 |
| | | | | 257/177 |
| 8,405,206 B1* | 3/2013 | Duetemeyer | ....... | H01L 23/3735 |
| | | | | 257/693 |
| 8,482,904 B2* | 7/2013 | Darroman | ............ | H02M 7/003 |
| | | | | 361/624 |
| 8,736,043 B2* | 5/2014 | Konno | ................ | H01L 29/417 |
| | | | | 257/693 |
| 2009/0257211 A1* | 10/2009 | Kontani | ................ | H01L 23/642 |
| | | | | 361/782 |
| 2014/0002938 A1* | 1/2014 | Tong | ................ | H02H 3/02 |
| | | | | 361/78 |
| 2014/0120774 A1* | 5/2014 | Kim | ................ | H01L 31/0504 |
| | | | | 439/626 |
| 2014/0346659 A1* | 11/2014 | Nakamura | ............ | H02M 7/003 |
| | | | | 257/704 |
| 2015/0043131 A1* | 2/2015 | Yu | ................ | H05K 7/1457 |
| | | | | 361/622 |
| 2016/0057881 A1* | 2/2016 | Tada | ................ | H05K 7/1432 |
| | | | | 361/728 |

\* cited by examiner

POWER MODULE HAVING PACKAGING STRUCTURE

TECHNICAL FIELD

The present invention relates to a power module having a packaging structure and, in particular, to a low-stray-inductance power module having a packaging structure.

BACKGROUND

In the industrial automation or the electric carrier field nowadays, there is an increasing demand for inverter capable of handling high voltage and high loading, which brings many challenges in designing a power module. One of these challenges is designing terminals of the power module, which are connected to an outer circuit. The outline and arrangement of the terminals will affect a stray inductance value of the power module. If the design is improper, the stray inductance value will be overly high, and products with low breakdown voltage will be damaged easily. Besides, the terminals are usually soldered to the substrate, so there is a high possibility of solder cracking, and the cracks are tending to enlarge, leading to malfunction of the product. Moreover, during the process of fixing the outside circuit to the terminals by screws or the likes, an external force is exerted to fasten the screw, however, this force is also imparted to the solder where the terminal and the substrate are bonded, thus causing the crack to be generated or enlarged.

Please refer to FIG. 1, a perspective view showing a conventional power module structure. The power module 100A includes a substrate 1A and a plurality of switch units 2A. A bottom of the switch units 2A is in physical contact with and is electrically connected to a first terminal 31A, and a surface of the switch units 2A is electrically connected to a second terminal 32A with a wire. As shown in FIG. 1, it is required to arrange the switch units 2A parallel to each other in order to reduce parasitic inductance, and each of conductive areas 11A, 12A of the substrate 1A forms a U-shaped circuit to achieve the parallel arrangement of the switch units 2A. On the premise that the design can withstand voltage as required, a distance between the conductive areas 11A, 12A should be as small as possible. Moreover, it is also necessary to arrange the first terminal 31A and the second terminal 32A parallel to each other, and to make a distance therebetween as small as possible, on the premise that the design can withstand voltage as required, so as to reduce inductance. However, the power module 100A still has a large crossover area, so it is still difficult to reduce stray inductance of the whole circuit sufficiently.

Please refer to FIGS. 2A and 2B, a perspective view showing another conventional power module structure and a schematic view showing a metal board of another conventional power module structure. The power module 100B includes a plurality of switch units (not illustrated) and a plurality of terminals 31B, 32B, 33B. The switch units are soldered to conductive areas 11B, 12B of a substrate 1B. The terminals 31B, 32B, 33B are also soldered to the substrate 1B which connected the signal between an outside circuit and power units inside. A metal plate 4 is provided at an outer side of the three terminals 31B, 32B, and 33B to reduce inductance effectively.

The metal plate 4 serves to generate a reversed current when a current flows through the third terminal 33B from the first terminal 31B or flows through the second terminal 32B from the third terminal 33B. The reversed current generates a magnetic field that against the current of the terminals 31B, 32B, and 33B to reduce inductance. According to FIGS. 2A and 2B, the power module 100B mainly improves the terminals 31B, 32B, and 33B, however, it also fails to reduce the crossover area of the power module 100B.

Therefore, the inventor aims to solve the aforesaid problems by inventing a low-stray-inductance power module having a packaging structure, wherein a plurality of terminals and a plurality of switch units are arranged parallel to each other to reduce inductance of the power module and to achieve uniform current distribution. In addition, by means of the structure design, the terminals are bonded strongly to thereby improve reliability and to prolong a lifespan of the power module.

SUMMARY

It is an object of the present invention to solve the above-mentioned problems. The present invention has a plurality of terminals and a plurality of switch units arranged parallel to each other, so that current has a straight flow path from an input end to an output end, and current is distributed uniformly in a power module, and thereby a crossover area of the power module is reduced, and inductance is lowered to solve the existing problems of the conventional techniques.

Accordingly, the present invention provides a power module having a packaging structure, the power module being electrically connected to an outside circuit, and comprising: a substrate, the substrate having a first conductive area, a second conductive area and a third conductive area, and a first fixing area being disposed between the first conductive area and the second conductive area, the first fixing area being electrically connected to the first conductive area, and a second fixing area being disposed between the second conductive area and the third conductive area, the second fixing area being electrically connected to the second conductive area, the first conductive area, the second conductive area, the third conductive area, the first fixing area, and the second fixing area being arranged parallel to each other; a first terminal, the first terminal being a current input end electrically connected to the first conductive area; a second terminal, the second terminal being an intermediate end electrically connected to the second conductive area; a third terminal, the third terminal being a current output end electrically connected to the third conductive area; a first switch set, the first switch set being electrically connected to the first fixing area and the second conductive area; and a second switch set, the second switch set being electrically connected to the second fixing area and the third conductive area, wherein when current flows from the current input end and the first switch set to the intermediate end, or flows from the intermediate end and the second switch set to the current output end, the current has a straight current flow path.

According to one embodiment, a first width L1 of the first terminal, the second terminal and the third terminal, and a second width L2 of the first switch set and the second switch set satisfy an equation: L1/L2≥0.75.

According to one embodiment, the substrate further includes at least one signal testing transmission area electrically connected to the first conductive area, the second conductive area, or the third conductive area.

According to one embodiment, the power module further includes at least one connector, and the connector is electrically connected to the corresponding signal testing transmission area.

According to one embodiment, a pin inside the connector is electrically connected to an outside testing circuit or an outside signal circuit.

According to one embodiment, each of the first terminal, the second terminal and the third terminal includes a first fixing portion and a second fixing portion.

According to one embodiment, the first fixing portion includes a connection portion connected to the outside circuit, and the second fixing portion includes at least one fixing face fixedly connected to the substrate.

According to one embodiment, the first fixing portion and the second fixing portion are in an L shape respectively and are connected to form a stairs shape.

According to one embodiment, the power module further comprising: a housing, the housing defining an accommodating space with the substrate for accommodating the first terminal, the second terminal, the third terminal, the first switch set, and the second switch set, wherein each of the first terminal, the second terminal, and the third terminal has a connection portion, the housing includes a plurality of through holes, and the connection portions protrude the through holes correspondingly.

According to one embodiment, each of the first terminal, the second terminal, and the third terminal includes a first fixing portion and a second fixing portion, and the first fixing portion has the connection portion connected to the outside circuit.

According to one embodiment, the connection portion is bendable to one side after protruding out of the housing.

According to one embodiment, the connection portion includes at least one positioning hole, the housing further includes at least one fastening recess corresponding to the positioning hole, and the positioning hole is aligned with the fastening recess when the connection portion is bent.

According to one embodiment, a fastening element is disposed in each of the fastening recesses.

According to one embodiment, the fastening element is a nut.

According to one embodiment, an end portion of the fixing face has a stair-shaped structure.

According to one embodiment, the stair-shaped structure includes at least one stair.

According to one embodiment, the fixing face has a serration structure.

According to one embodiment, the fixing face is soldered to the substrate.

According to one embodiment, the fixing face is bonded to the substrate by ultrasonic welding.

Objectives, features and advantages of the present invention will become more readily apparent from the following detailed description and the accompanying drawing. However, it is to be understood that the descriptions and the accompany drawings disclosed herein are merely illustrative and exemplary and not intended to limit the scope of the present invention.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings.

Figure 1:
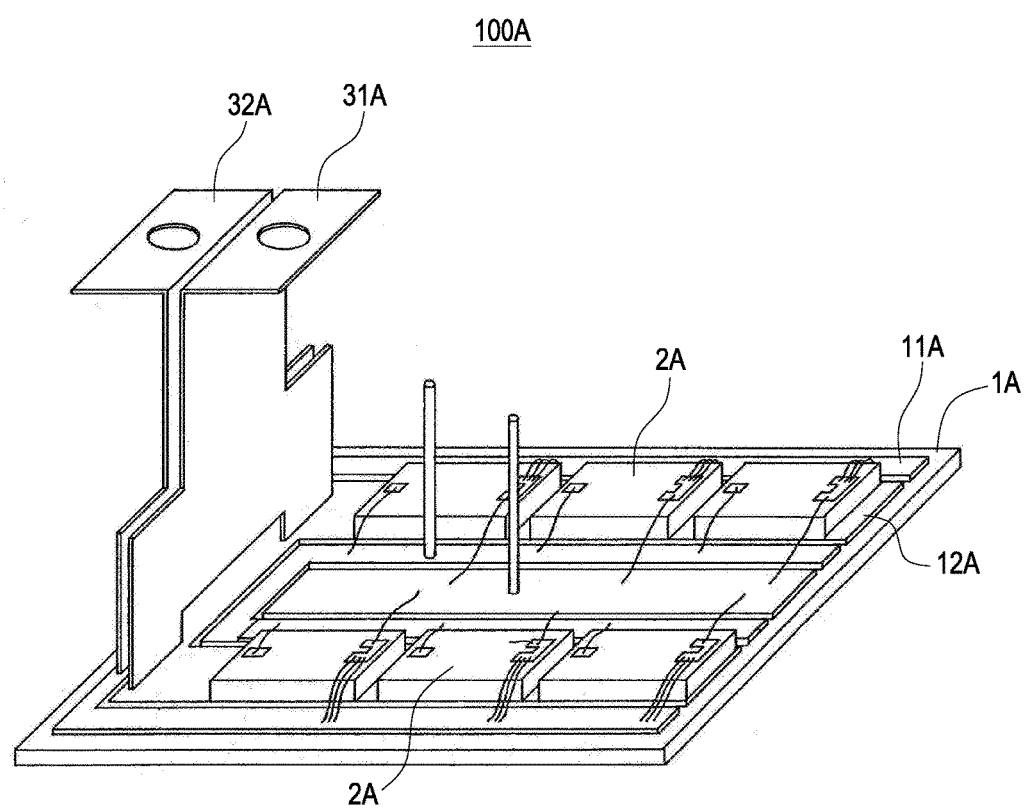
FIG. 1 is a perspective view showing a conventional power module structure.
Figure 2A:
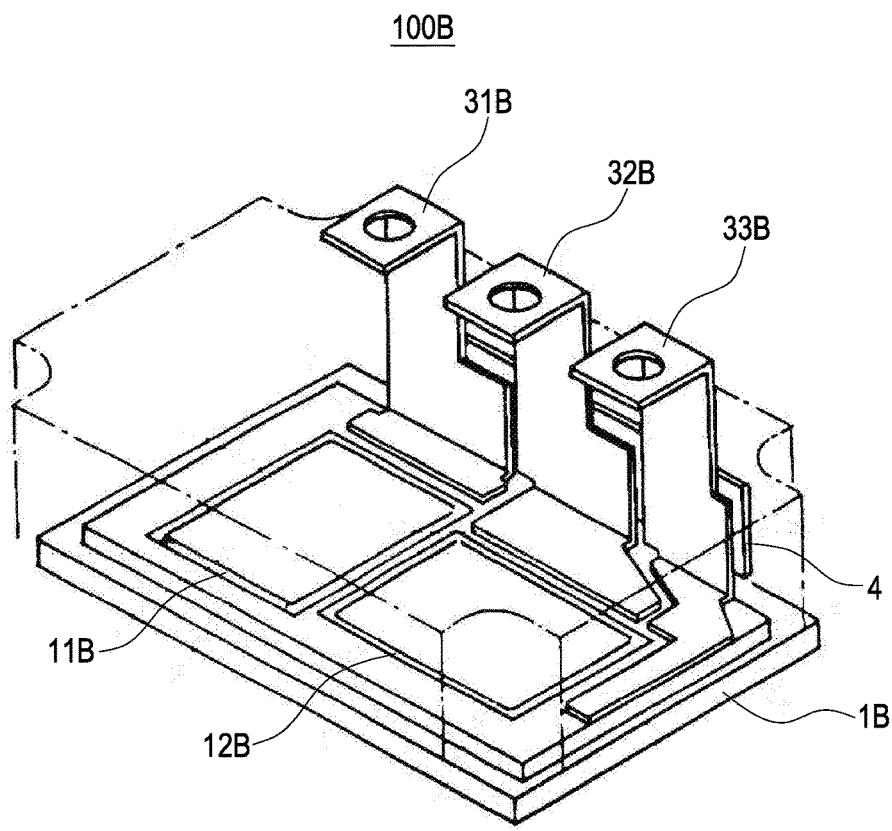
FIG. 2A is a perspective view showing another conventional power module structure.
Figure 2B:
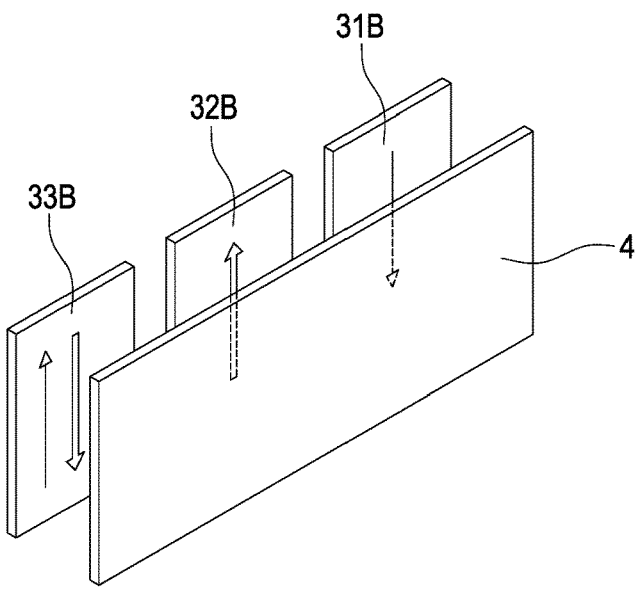
FIG. 2B is a schematic view showing a metal board of another conventional power module structure.
Figure 3:
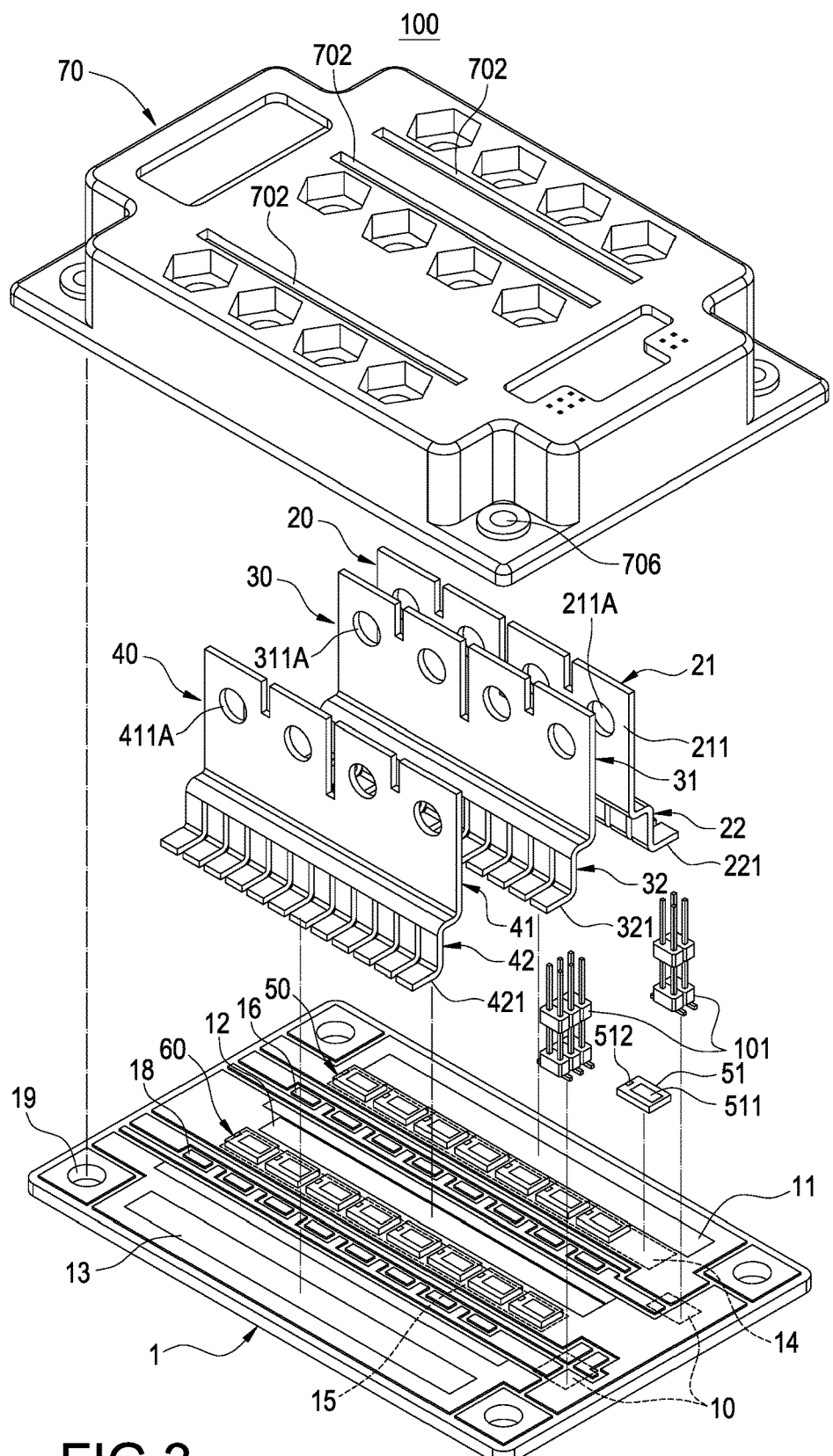
FIG. 3 is a perspective exploded view showing a power module having a packaging structure according to the present invention.

Please refer to FIG. 3 which is a perspective exploded view showing a power module having a packaging structure according to the present invention. The power module 100 includes a substrate 1. The substrate 1 at least includes a first conductive area 11, a second conductive area 12, and a third conductive area 13. A first fixing area 14 is disposed between the first conductive area 11 and the second conductive area 12. The first fixing area 14 is electrically connected to the first conductive area 11 via the substrate 1. A second fixing area 15 is disposed between the second conductive area 12 and the third conductive area 13, and the second fixing area 15 is electrically connected to the second conductive area 12 via the substrate 1. The first conductive area 11, the second conductive area 12 and the third conductive area 13 are not electrically connected to each other. The first conductive area 11 and the third conductive area 13 are disposed at two opposite ends of the substrate 1, respectively. As shown in FIG. 3, a plurality of first signal areas 16 are disposed between the first fixing area 14 and the second conductive area 12, and the first signal area 16 is configured to be electrically connected to the substrate 1 and a first switch set 50. A plurality of second signal areas 18 are disposed between the second fixing area 15 and the third conductive area 13. The second signal area 18 is configured to be electrically connected to a second switch set 60. Moreover, the first conductive area 11, the second conductive area 12, the third conductive area 13, the first fixing area 14, and the second fixing area 15 are arranged parallel to each other. As shown in FIG. 3, the substrate 1 further includes at least one signal testing transmission area 10 and a plurality of first fastening portions 19. The signal testing transmission areas 10 are electrically connected to the first conductive area 11, the second conductive area 12, and the third conductive area 13 correspondingly. The first fastening portions 19 are disposed at corners of the substrate 1. Note that any design, layout or configuration, containing the first conductive area 11, the second conductive area 12, the third conductive area 13, the first fixing area 14, and the second fixing area 15 in a parallel arrangement to each other, is deemed within the scope of the present embodiment. Furthermore, the substrate 1 can be a circuit board made by using a direct bond copper (DBC) method; however, the present invention is not limited in this regard. Therefore, any structure or material that can achieve the above-mentioned electrical connection of the substrate 1 is deemed within the scope of the present embodiment.

Referring to FIG. 3, the power module 100 further includes a first terminal 20, a second terminal 30 and a third terminal 40. The first terminal 20 is electrically connected to the first conductive area 11. The second terminal 30 is electrically connected to the second conductive area 12. The third terminal 40 is electrically connected to the third conductive area 13. each of the group of the first terminal 20, the second terminal 30 and the third terminal 40 has an L-shaped first fixing portion 21, 31, 41 and an L-shaped second fixing portion 22, 32, 42, and the first fixing portions 21, 31, 41 and the second fixing portions 22, 32, 42 are connected to substantially form a stairs shape. Also referring to FIGS. 4B and 5, each of the group of the first fixing portions 21, 31, 41 includes a connection portion 211, 311, 411, and each of the group of the connection portions 211, 311, 411 includes at least one positioning hole 211A, 311A, 411A for fixed electrical connection with an outside circuit (not illustrated). Each of the group of the second fixing portions 22, 32, 42 includes at least one fixing face 221, 321, 421 fixedly connected to the first conductive area 11, the second conductive area 12 and the third conductive area 13 of the substrate 1 correspondingly. As shown in FIG. 3, each of the group of the second fixing portions 22, 32, 42 consists of a plurality of pins, so each pin has a fixing face 221, 321, 421. It should be noted that, the pins serve to electrically fix tightly and securely the first terminal 20, the second terminal 30 and the third terminal 40 to the substrate 1 by means of the fixing faces 221, 321, 421, so there is no need to limit the number of the pins, and there could be one or multiple pins as required.

Figure 4A:
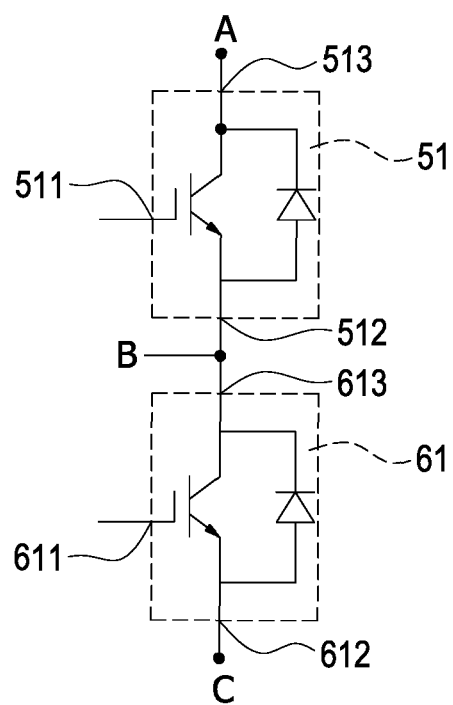
FIG. 4A is an equivalent circuit diagram of the power module having the packaging structure according to the present invention.

Referring to FIGS. 3 and 4A, the power module 100 further includes a first switch set 50. The first switch set 50 includes a plurality of first switch units 51. The first switch unit 51 includes a first signal end 511, a first output end 512 and a first input end 513. The first input end 513 of the first switch unit 51 is electrically connected to the first fixing area 14 of the substrate 1. The first output end 512 of the first switch unit 51 is electrically connected to the second conductive area 12. The first signal end 511 of the first switch unit 51 is electrically connected to the first signal area 16. The power module 100 further includes a second switch set 60 which has a plurality of second switch units 61. The second switch unit 61 includes a second signal end 611, a second output end 612 and a second input end 613. The second input end 613 of the second switch unit 61 is electrically connected to the second fixing area 15 of the substrate 1. The second output end 612 of the second switch unit 61 is electrically connected to the third conductive area 13. The second signal end 611 of the second switch unit 61 is electrically connected to the second signal areas 18. It should be noted that, in this present embodiment, the first switch units 51 and the second switch units 61 are implemented by metal-oxide-semiconductor-field-effect transistors (MOSFETs); however, the present invention is not limited in this regard. Therefore, the first switch units 51 and the second switch units 61 can be, but not limited to, implemented by insulated gate bipolar transistors (IGBTs) or bipolar junction transistors (BJTs).

Referring to FIG. 3, the power module 100 further includes at least one connector 101. The connector 101 is electrically connected to the signal testing transmission area 10, and the connector 101 is electrically connected to the first conductive area 11, the second conductive area 12 or the third conductive area 13. It should be noted that, the signal testing transmission area 10 is not limited to, for example, the position illustrated in FIG. 3, and FIG. 3 is an example for illustration. Thus, the signal testing transmission area 10 can be disposed at an opposite side of the place where it is presently disposed in FIG. 3. As shown in FIG. 3, the power module 100 further includes a housing 70. The housing 70 defines an accommodating space (not illustrated) with the substrate 1, and thus accommodates the first terminal 20, the second terminal 30, the third terminal 40, the first switch set 50, and the second switch set 60, and the connectors 101 by the accommodating space. The housing 70 includes a plurality of through holes 702, and the connection portions 211, 311, 411 and the connectors 101 are inserted through the through holes 702 to protrude out of the housing 70. Techniques of bending the connection portions 211, 311, 411 will be described later.

Please refer to FIG. 4A which is an equivalent circuit diagram of the power module having the packaging structure according to the present invention. Also referring to FIG. 3, the first terminal 20 can be a current input end A, and the current input end A (the first terminal 20) is electrically connected to the first input end 513 of the first switch unit 51 of the first switch set 50. The first output end 512 of the first switch unit 51 is electrically connected to the second terminal 30, here the second terminal 30 can be an intermediate end B, and the intermediate end B (the second terminal 30) can be electrically connected to the outside circuit. The intermediate end B (the second terminal 30) is electrically connected to the second input end 613 of the second switch unit 61 of the second switch set 60. The second output end 612 of the second switch unit 61 is electrically connected to the third terminal 40, and the third terminal 40 can be a current output end C. The first signal end 511 and the second signal end 611 receive at least one switch signal transmitted from the connectors 101.

Figure 4B:
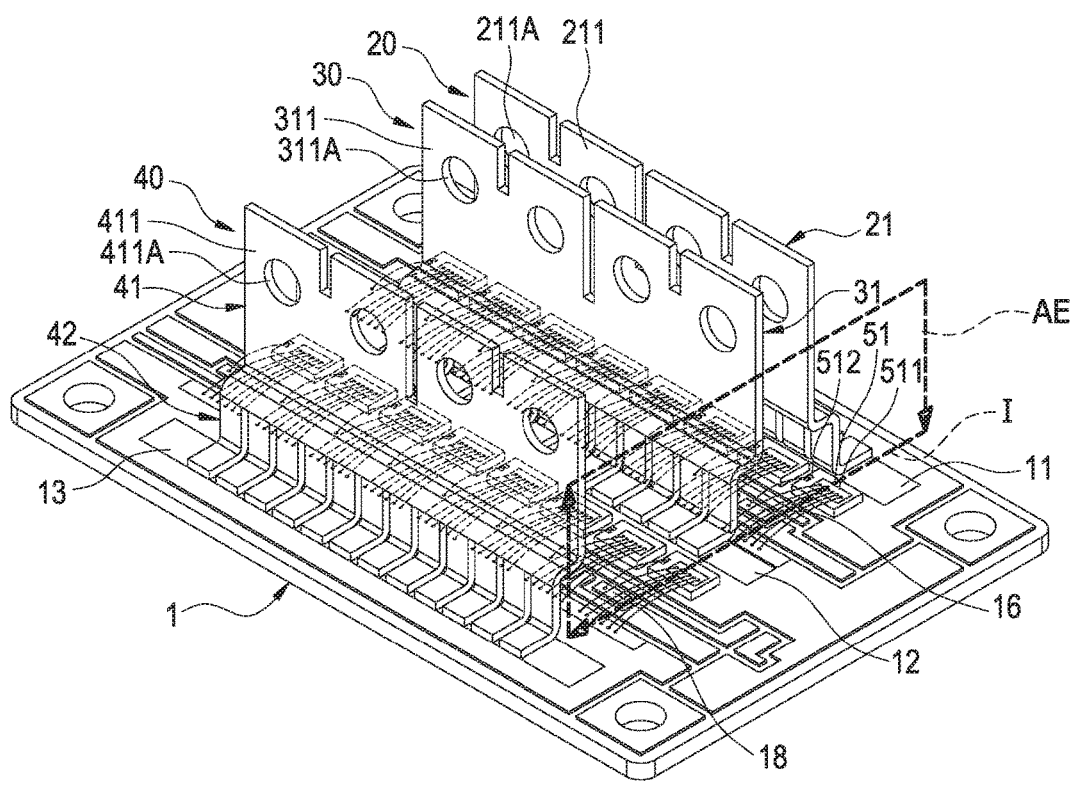
FIG. 4B is a schematic view showing a current flow path of the power module having the packaging structure according to the present invention.

Please refer to FIG. 4B which is a schematic view showing a current flow path of the power module having the packaging structure according to the present invention. Also referring to FIGS. 3 and 4A, the first signal areas 16 are electrically connected to each other and are electrically connected to the corresponding connectors 101, respectively. The second signal areas 18 are electrically connected to each other and are electrically connected to the corresponding connectors 101, respectively, and the pins inside the connectors 101 are electrically connected to an outside testing circuit (not illustrated) or an outside signal circuit (not illustrated) for testing, measuring, or inputting signals. As shown in FIG. 4B, the arrow indicates a current flow path of current I. The current flow path of the current I defines a crossover area AE. Generally, the size of the crossover area AE affects an inductance value of the power module 100, so the crossover area AE should be better as small as possible. As shown in FIG. 4B, when the current I flows from the current input end A and through the first switch set 50 to the intermediate end B, or flows from the intermediate end B and through the second switch set 60 to the current output end C, the current I has a substantially straight current flow path, and at this moment, the crossover area AE is the smallest in size. Therefore, the inductance value calculated based on the current flow path of the current I of the power module 100 of the present embodiment is 35% less than the inductance value of a conventional power module.

Figure 4C:
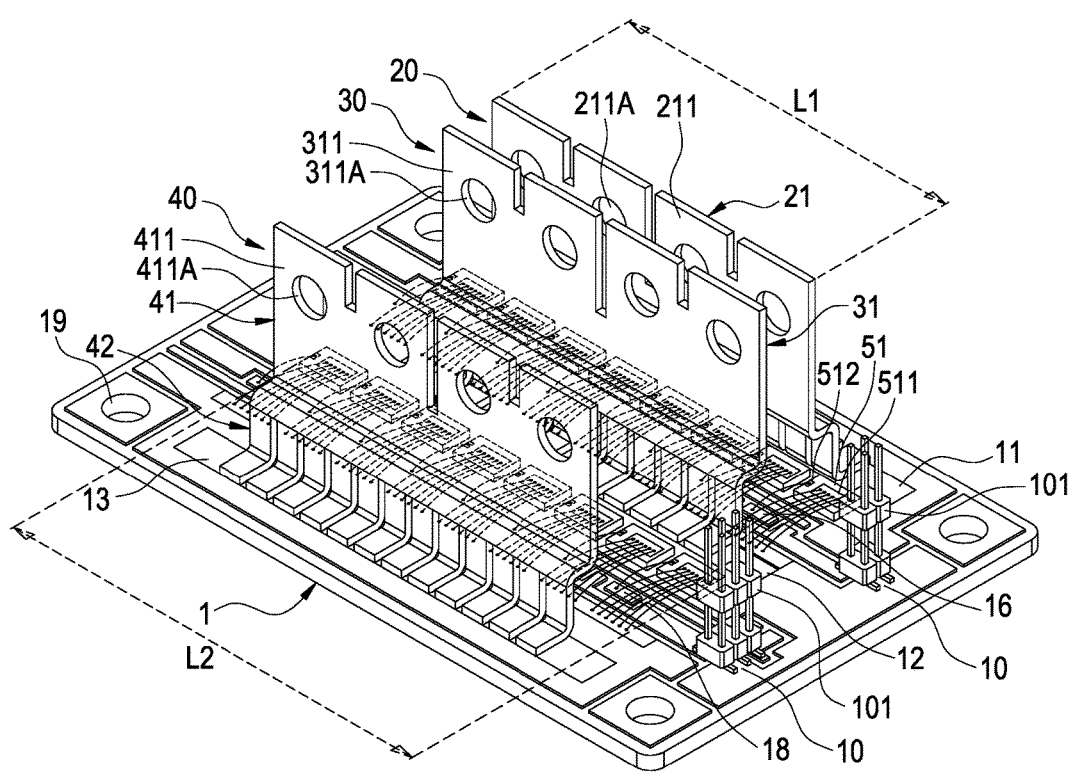
FIG. 4C is a top view showing the power module having the packaging structure according to the present invention.

Please refer to FIG. 4C which is a top view showing the power module having the packaging structure according to the present invention. Also referring to FIG. 3, all of the first terminal 20, the second terminal 30 and the third terminal 40 have a first width L1, and all of the first switch set 50 and the second switch set 60 have a second width L2, and wherein the first width L1 and the second width L2 satisfy an equation: $L1/L2 \geq 0.75$. Generally, the first terminal 20, the second terminal 30 and the third terminal 40 of the present embodiment, having a larger width and a parallel arrangement to each other, provide a lower inductance than that provided by a conventional terminal structure having a smaller width, thus also facilitating uniform current distribution. It should be noted that, in FIG. 4C, the first switch set 50 includes eight first switch units 51, and the second switch set 60 includes eight second switch units 61; however, the number of the first switch units 51 and the number of the second switch units 61 are merely representative for purposes of describing the present example embodiment of the present invention, and the present invention is not limited to the specific numbers disclosed herein. Therefore, the first switch set 50, the second switch set 60, the first terminal 20, the second terminal 30, and the third terminal 40 can be constructed or configured differently, as long as the design satisfies the above-mentioned equation of the first width L1 in relation with the second width L2. As shown in FIG. 4C, the first width L1 of the first terminal 20, the second terminal 30 and the third terminal 40 is longer than a width of a terminal of the conventional invention. As a result, the power module 100 of the present embodiment provides lower inductance which is 46.6% less than that of the conventional power module. Furthermore, as shown in FIG. 4C, the first terminal 20, the second terminal 30, the third terminal 40, the first switch set 50, and the second switch set 60 of the present embodiment are arranged parallel to each other, so the current flowing path of the current I will not have different lengths to cause uneven distribution of the current I on the first switch units 51 of the first switch set 50 and on the second switch units 61 of the second switch set 60 at different positions, and a current density of the power module 100 is also reduced. Consequently, the current density of the power module 100 of the present embodiment is 25% less than a current density of the conventional power module.

Figure 5A:
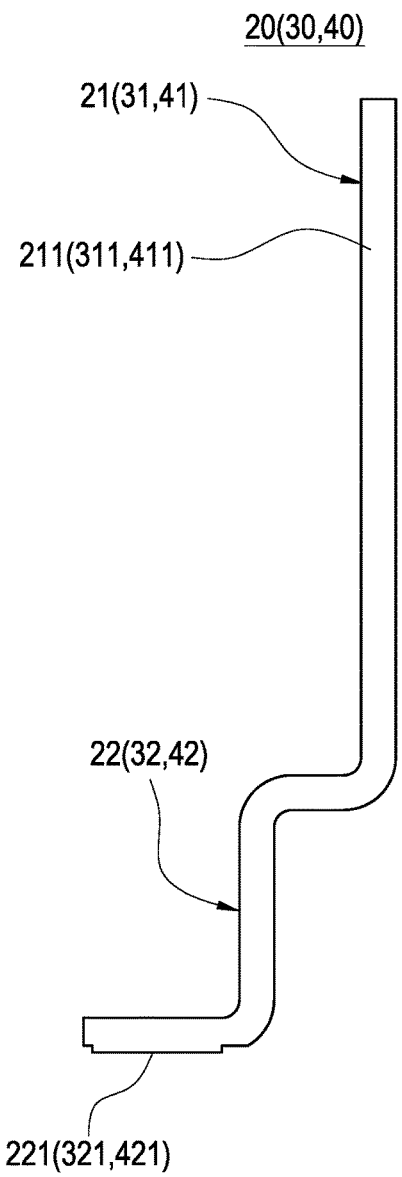
FIG. 5A is a side view showing a terminal of the power module having the packaging structure according to the first embodiment of the present invention.
Figure 5B:
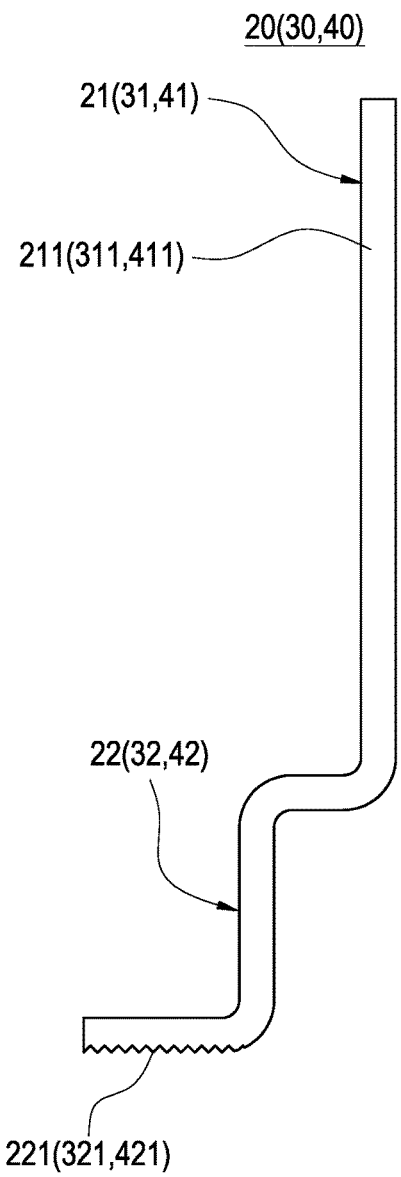
FIG. 5B is a side view showing a terminal of the power module having the packaging structure according to the second embodiment of the present invention.

Please refer to FIG. 5A, a side view showing a terminal of the power module having the packaging structure according to the first embodiment of the present invention. Also referring to FIG. 3, a center of each of the group of the fixing faces 221, 321, 421, disposed at a lower side of the first terminal 20, the second terminal 30 and the third terminal 40 correspondingly protrudes further than an end portion, and the end portion has a stair-shaped structure. The stair-shaped structure includes at least one stair. Please refer to FIG. 5B, a side view showing a terminal of the power module having the packaging structure according to the second embodiment of the present invention. Also referring to FIGS. 3 and 5A, each of the group of the fixing faces 221, 321, 421 has a serration structure. The fixing faces 221, 321, 421 are soldered to the substrate 1 or bonded to the substrate 1 by ultrasonic welding. On condition that the power module is in harsh environment (i.e. the temperature is continuously high or continuously low, or the temperature cycles repeatedly between high and low temperatures), there is a high possibility of solder cracking resulting from a mismatch between the thermal expansion coefficients of the substrate 1 and the fixing faces 221, 321, 421 of the first terminal 20, the second terminal 30 and the third terminal 40. When the solder cracks due to severe environment, and if the fixing faces 221, 321, 421 are flat, a joined area of the solder is small, and as a result, the connection strength at the solder is inferior. In addition to that, the cracks tend to enlarge, so that the first terminal 20, the second terminal 30 and the third terminal 40 break or become loosened at the solder, which leaves the power module 100 malfunctioning or not working. Hence, by utilizing the stair-shaped structure or the serration structure of the fixing faces 221, 321, 421 as mentioned, the joined area of the solder increases, and thereby the solder has better connection strength and is prevented from cracking for a longer time. Moreover, even when the solder cracks due to severe environment, the stair-shaped structure or the serration structure has multiple edges and corners thereof, and thereby cracks are stopped from enlarging or going forward upon encountering the edges and corners. Accordingly, the reliability and the durability of the power module 100 are improved. Hence, by utilizing the stair-shaped structure or the serration structure, the solder at high temperature (125° C.) has a strain which is 18% less than that of a flat structure, and the solder at low temperature (−40° C.) has a strain which is 29% less than the strain of the flat structure.

Figure 6A:
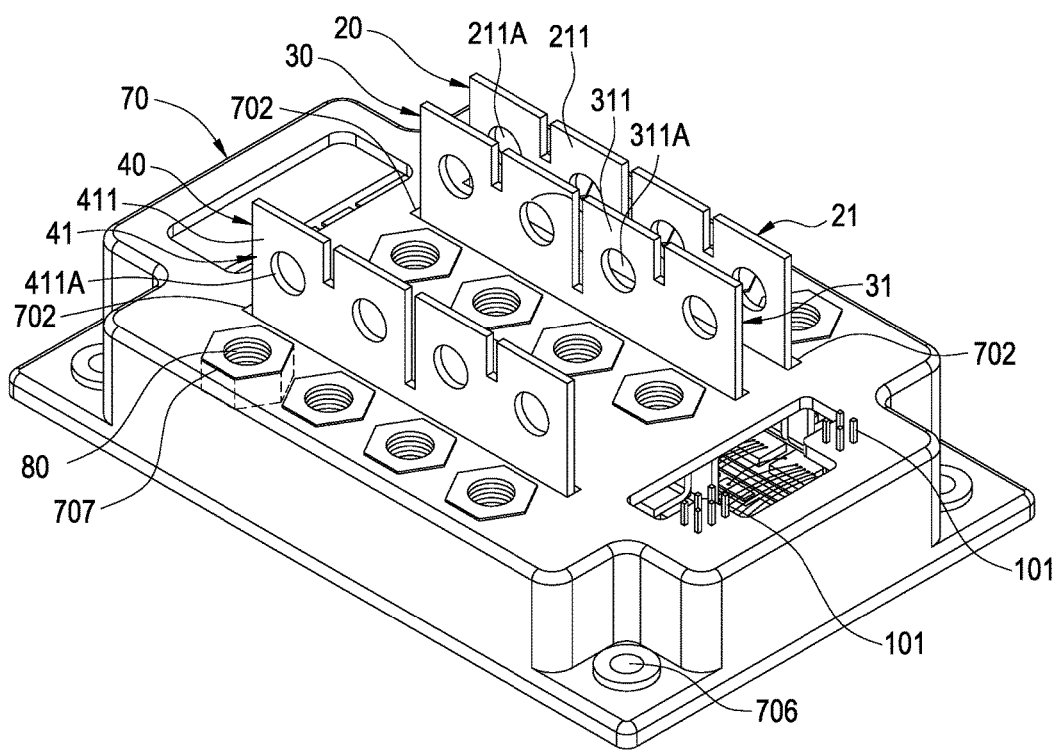
FIG. 6A is a schematic view showing a substrate and a housing of the power module having the packaging structure of the present invention.
Figure 6B:
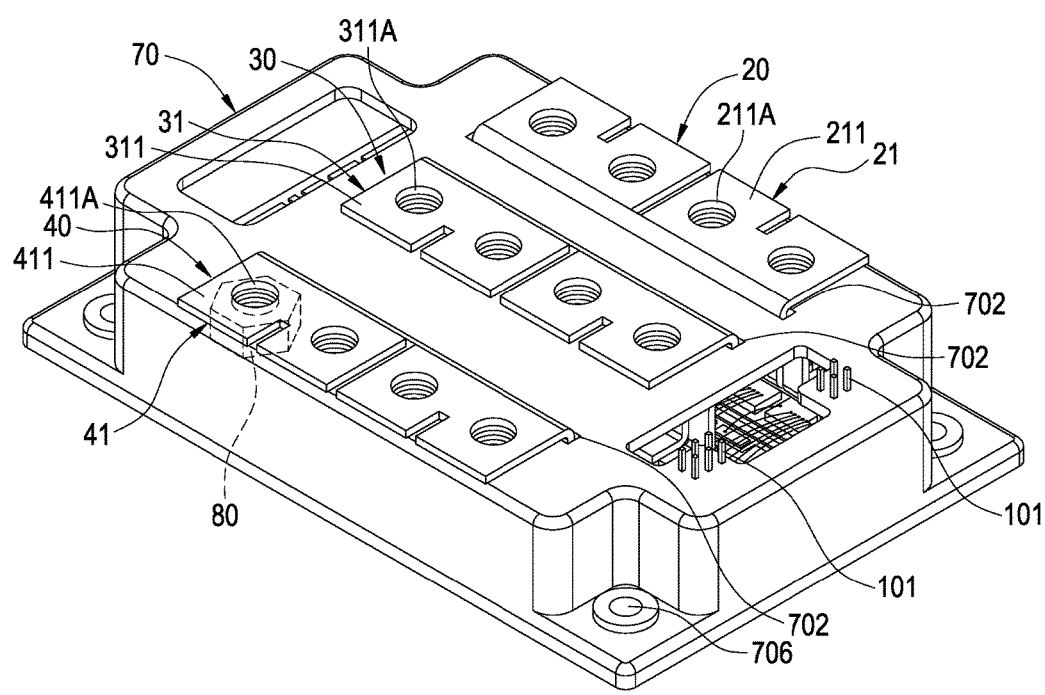
FIG. 6B is a perspective view showing the power module having the packaging structure of the present invention after a connection portion is bent.

Please refer to FIG. 6A, a schematic view showing the substrate and the housing 70 of the packaging structure of the present invention. Also referring to FIG. 3, the housing 70 further includes a plurality of second fastening portions 706 corresponding to the first fastening portions 19 of the substrate 1. The first fastening portions 19 and the second fastening portions 706 are provided for insertion of a fastener (not illustrated) so as to fix the substrate 1 and the housing 70. As shown in FIG. 6A, the housing 70 further includes at least one fastening recess 707. A fastening element 80 can be disposed in the fastening recess 707, and the fastening element 80 can be a nut. Please refer to FIG. 6B, a perspective view showing the power module having the packaging structure of the present invention after the connection portion is bent. Also referring to FIGS. 3 and 6A, the connection portions 21, 31, 41 can be bent toward the fastening recess 707 by an angle, and the angle is preferably 90 degrees. After the connection portions 21, 31, 41 are bent, the positioning holes 211A, 311A, 411A of the connection portions 211, 311, 411 are aligned with the fastening recesses 707 correspondingly, and by means of a bolt or a screw the outside circuit (not illustrated) is electrically connected to the first terminal 20, the second terminal 30 and the third terminal 40 correspondingly.

In summary, the present invention has the following merits:

(1) The first terminal, the second terminal and the third terminal have the first width equal to or more than three-fourths of the second width of the first switch set and the second switch set, so that the current flowing through the power module is evenly distributed, and the current density is reduced, thereby preventing some switch units in the first switch set or the second switch set from receiving relative large current and being damaged.

(2) The first terminal, the second terminal, the third terminal, the first switch set, and the second switch set are arranged parallel to each other, and thereby the current flow path of the current flowing through the switch units will not have different lengths to cause uneven current distribution.

(3) When the current flows from the first terminal to the second terminal, or from the second terminal to the third terminal, the current flows from the input end to the output end has a substantially straight current flow path, so the crossover area is reduced, and inductance is lowered.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A power module, having a packaging structure, comprising:
    a substrate having a first conductive area, a second conductive area and a third conductive area, and a first fixing area being disposed between the first conductive area and the second conductive area, the first fixing area being electrically connected to the first conductive area, and a second fixing area being disposed between the second conductive area and the third conductive area, the second fixing area being electrically connected to the second conductive area, the first conductive area, the second conductive area, the third conductive area, the first fixing area, and the second fixing area being arranged parallel to each other;
    a first terminal being a current input end electrically connected to the first conductive area;
    a second terminal being an intermediate end electrically connected to the second conductive area;
    a third terminal being a current output end electrically connected to the third conductive area;
    a first switch set being electrically connected to the first fixing area and the second conductive area; and
    a second switch set being electrically connected to the second fixing area and the third conductive area,
    wherein
        a current flows from the current input end, through the first switch set and then to the intermediate end along a first current path; or from the intermediate end, through the second switch set and then to the current output end along a second current path, and
        the first current path and the second current path are straight-line paths with a same direction.

2. The power module of claim 1, wherein a first width L1 of the first terminal, the second terminal and the third terminal, and a second width L2 of the first switch set and the second switch set satisfy an equation: L1/L2≥0.75.

3. The power module of claim 1, wherein the substrate further comprises at least one signal testing transmission area electrically connected to the first conductive area, the second conductive area, or the third conductive area.

4. The power module of claim 3, further comprising at least one connector electrically connected to the corresponding signal testing transmission area.

5. The power module of claim 1, wherein each of the first terminal, the second terminal and the third terminal comprises a first fixing portion and a second fixing portion.

6. The power module of claim 5, wherein the first fixing portion comprises a connection portion, and the second fixing portion comprises at least one fixing face fixedly connected to the substrate.

7. The power module of claim 5, wherein the first fixing portion and the second fixing portion are in an L shape respectively and are connected to form a stairs shape.

8. The power module of claim 1, further comprising:
    a housing defining an accommodating space with the substrate for accommodating the first terminal, the second terminal, the third terminal, the first switch set, and the second switch set, wherein each of the first terminal, the second terminal, and the third terminal has a connection portion, the housing comprises a plurality of through holes, and the connection portions protrude the through holes correspondingly.

9. The power module of claim 8, wherein each of the first terminal, the second terminal, and the third terminal comprises a first fixing portion and a second fixing portion, and the first fixing portion has the connection portion.

10. The power module of claim 9, wherein the connection portion is bendable to one side after protruding out of the housing.

11. The power module of claim 9, wherein the connection portion comprises at least one positioning hole, the housing further comprises at least one fastening recess corresponding to the positioning hole, and the positioning hole is aligned with the fastening recess when the connection portion is bent.

12. The power module of claim 11, wherein a fastening element is disposed in each of the fastening recesses.

13. The power module of claim 12, wherein the fastening element is a nut.

14. The power module of claim 9, wherein the second fixing portion comprises at least one fixing face fixedly connected to the substrate.

15. The power module of claim 14, wherein an end portion of the fixing face has a stair-shaped structure.

16. The power module of claim 15, wherein the stair-shaped structure has at least one stair.

17. The power module of claim 14, wherein the fixing face has a serration structure.

18. The power module of claim 14, wherein the fixing face is soldered to the substrate.

19. The power module of claim 14, wherein the fixing face is welded to the substrate by ultrasonic welding.

* * * * *